(12) United States Patent
Ockenfuss et al.

(10) Patent No.: US 8,072,768 B2
(45) Date of Patent: Dec. 6, 2011

(54) MULTILAYER PRINTED CIRCUIT BOARD STRUCTURE COMPRISING AN INTEGRATED ELECTRICAL COMPONENT, AND PRODUCTION METHOD THEREFOR

(75) Inventors: Ulrich Ockenfuss, Schiltach (DE); Thomas Gottwald, Dunningen-Seedorf (DE)

(73) Assignee: Schweizer Electronic AG, Schramberg (DE)

( * ) Notice: Subject to any disclaimer, the term of this patent is extended or adjusted under 35 U.S.C. 154(b) by 792 days.

(21) Appl. No.: 11/988,289

(22) PCT Filed: Jul. 4, 2006

(86) PCT No.: PCT/EP2006/006511
§ 371 (c)(1),
(2), (4) Date: Jan. 4, 2008

(87) PCT Pub. No.: WO2007/003414
PCT Pub. Date: Jan. 11, 2007

(65) Prior Publication Data
US 2009/0041994 A1 Feb. 12, 2009

(30) Foreign Application Priority Data
Jul. 4, 2005 (DE) .......................... 10 2005 032 489

(51) Int. Cl.
*H05K 1/18* (2006.01)
(52) U.S. Cl. ........ 361/761; 361/795; 361/762; 361/729; 361/735
(58) Field of Classification Search .................. 361/760, 361/761, 783, 790, 792, 793, 795, 762, 763, 361/764, 728, 729, 735, 736, 739, 748, 749, 361/750; 174/262; 438/209
See application file for complete search history.

(56) References Cited

U.S. PATENT DOCUMENTS

| | | | |
|---|---|---|---|
| 3,763,404 A | | 10/1973 | Aird |
| 5,401,688 A | | 3/1995 | Yamaji et al. |
| 5,426,263 A | | 6/1995 | Potter et al. |
| 5,851,854 A | * | 12/1998 | Haghiri-Tehrani et al. ... 438/118 |
| 5,888,624 A | * | 3/1999 | Haghiri et al. ............ 428/195.1 |
| 5,970,346 A | * | 10/1999 | Liaw ............................. 438/281 |
| 6,538,210 B2 | * | 3/2003 | Sugaya et al. ................ 174/258 |

(Continued)

FOREIGN PATENT DOCUMENTS
DE 3125518 4/1982
(Continued)

*Primary Examiner* — Hoa C Nguyen
(74) *Attorney, Agent, or Firm* — Shlesinger, Arkwright & Garvey LLP

(57) ABSTRACT

The invention relates to a multilayer printed circuit board structure comprising a stack of plurality of electrically insulating and/or electroconductive layers and at least one passive or active electrical component arranged inside the stack of layers, the component extending laterally only in part of the surface extension of the stack of layers. The invention also relates to a passive or active electrical component mounted on the stack, to an associated wiring, and to a corresponding production method. According to the invention, the insert is embedded between two electrically insulating liquid resin layers or prepreg layers extending over the entire surface and covering the insert on both sides, the insert being surrounded by a resin material that is liquefied by compression or lamination of the structure. The invention structure can be used in printed circuit board technology.

23 Claims, 7 Drawing Sheets

U.S. PATENT DOCUMENTS

| | | | |
|---|---|---|---|
| 2003/0189246 A1* | 10/2003 | Iwaki et al. | 257/706 |
| 2003/0219956 A1* | 11/2003 | Mori et al. | 438/393 |
| 2004/0169086 A1* | 9/2004 | Ohta et al. | 235/492 |
| 2005/0140007 A1* | 6/2005 | Jobetto | 257/738 |
| 2005/0179122 A1* | 8/2005 | Okawa et al. | 257/679 |
| 2006/0017133 A1 | 1/2006 | Oi et al. | |
| 2007/0119617 A1* | 5/2007 | Hayashi et al. | 174/260 |

FOREIGN PATENT DOCUMENTS

| | | |
|---|---|---|
| DE | 690 31 350 | 11/1991 |
| DE | 196 27 543 | 11/1997 |
| EP | 3574207 | 12/1993 |
| EP | 1 230 680 | 5/2001 |

* cited by examiner

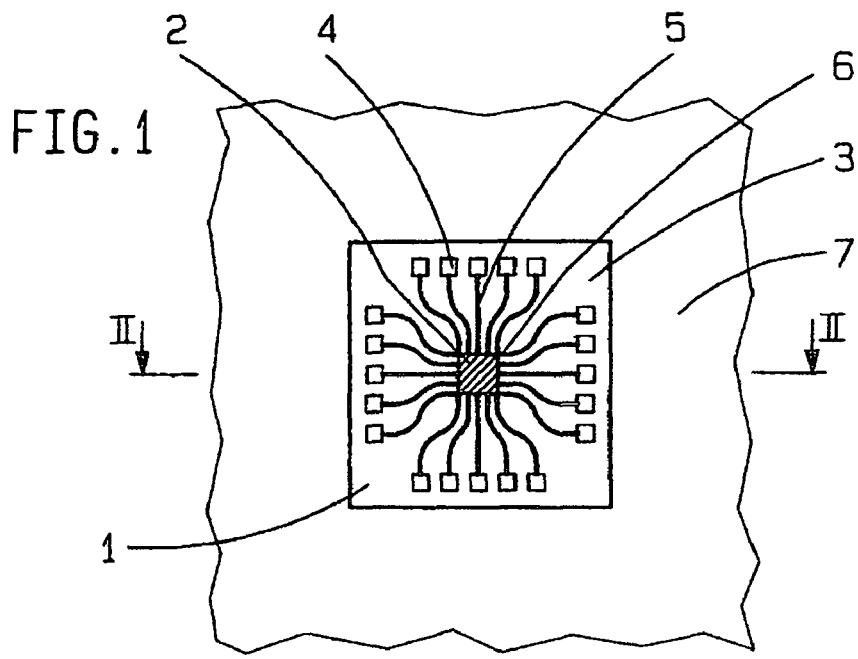
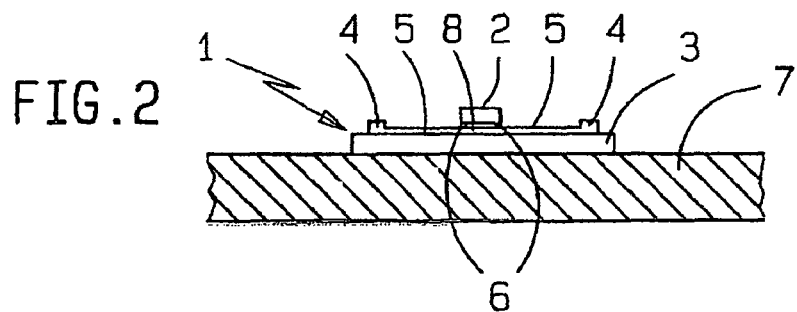
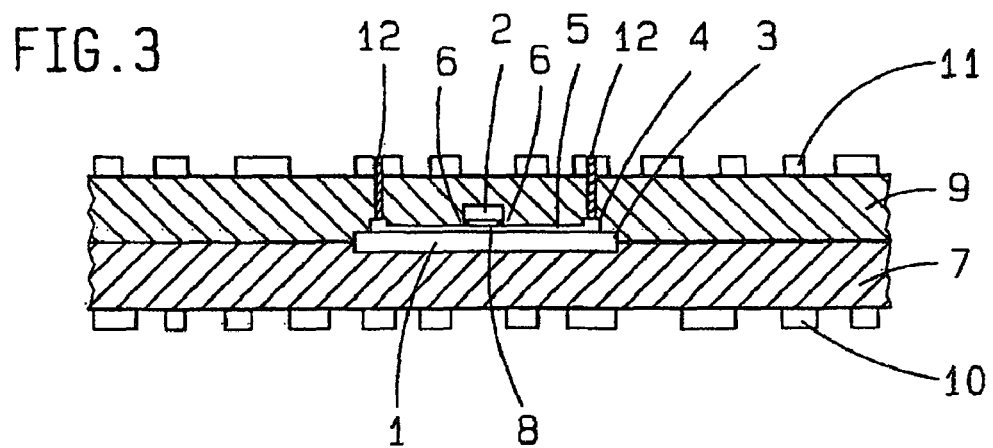

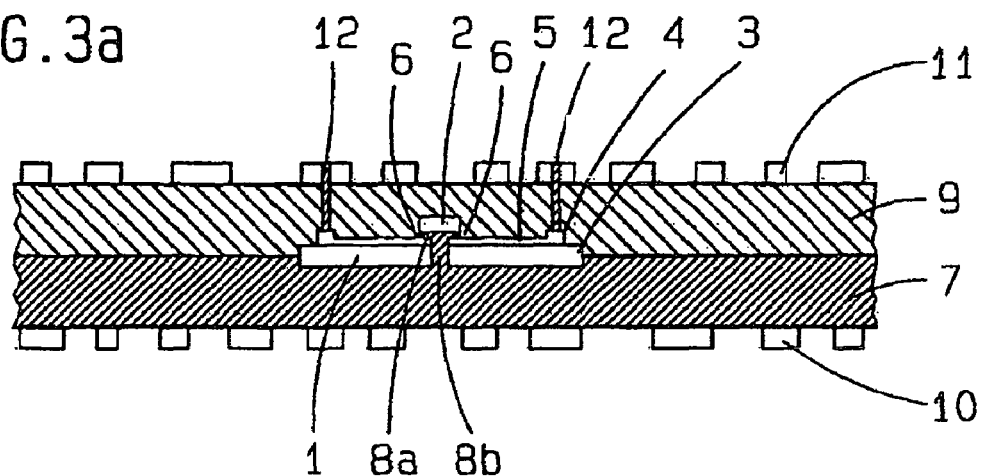
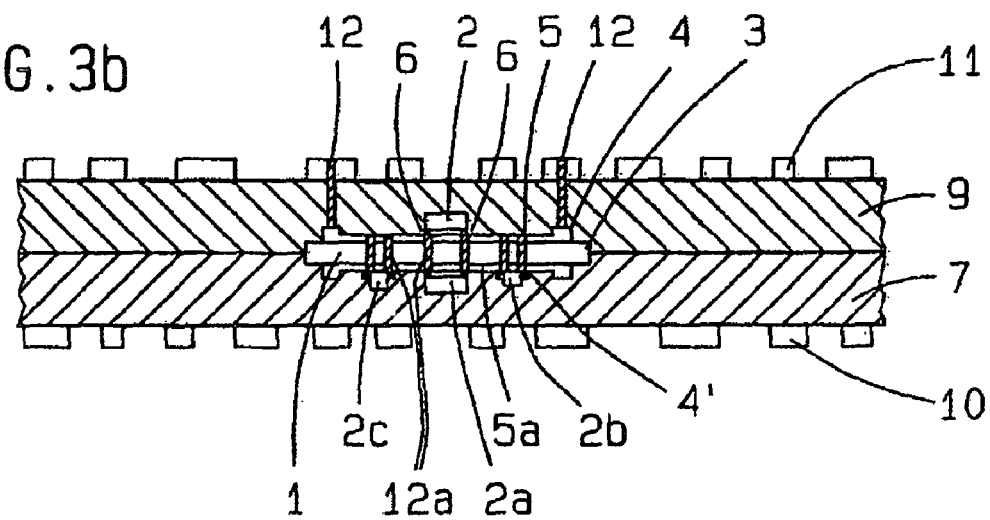

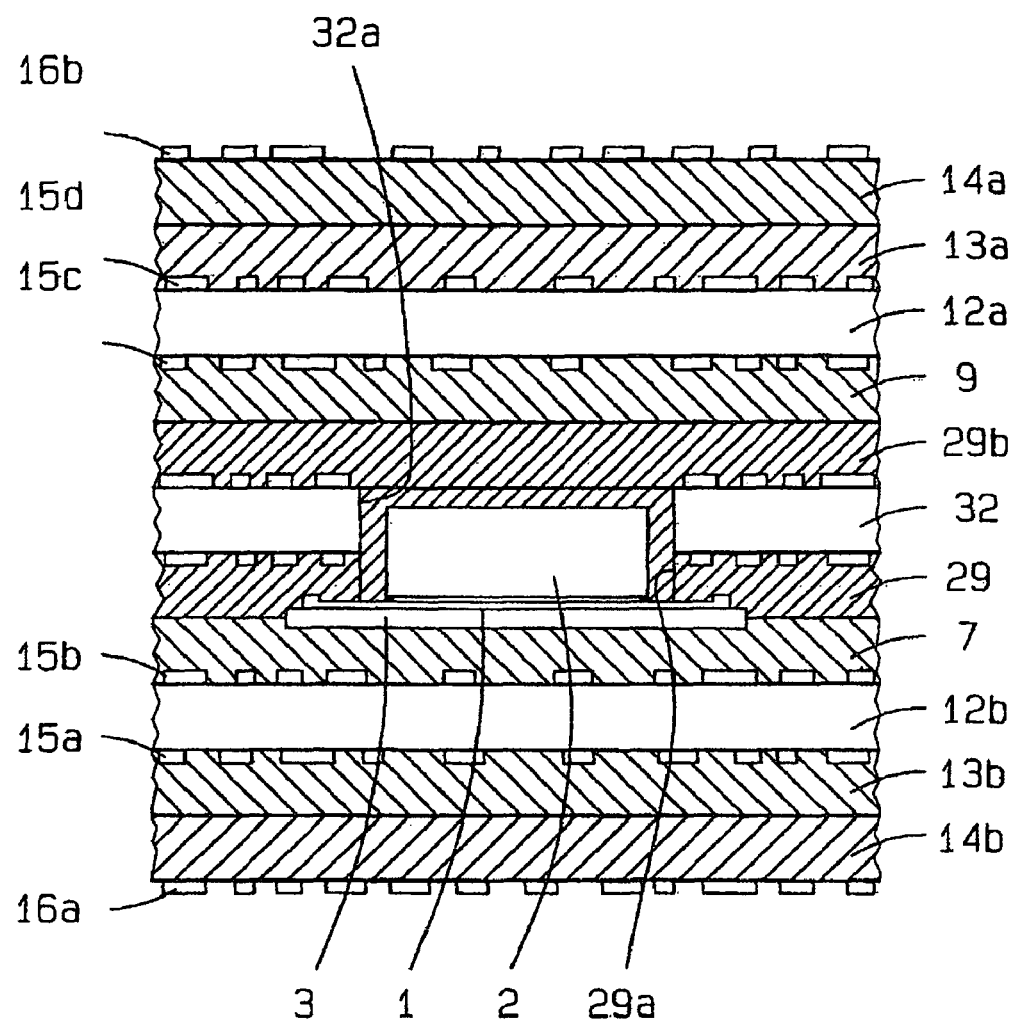

MULTILAYER PRINTED CIRCUIT BOARD STRUCTURE COMPRISING AN INTEGRATED ELECTRICAL COMPONENT, AND PRODUCTION METHOD THEREFOR

RELATED APPLICATIONS

This is a national stage of International PCT Application No. PCT/EP2006/006511, filed Jul. 4, 2006, which claims the priority benefit of German Application No. 10 2005 032 489.4, filed on Jul. 4, 2005, both of which are hereby incorporated by reference.

FIELD OF THE INVENTION

The invention relates to a multilayer printed circuit board structure and to an associated production method. Here, the term electrical component also comprises electronic components.

BACKGROUND OF THE INVENTION

Multilayer printed circuit board structures comprising a layer stack made from a number of layers that are electrically insulating and/or provided with conductor track structures and at least one passive or active electrical component in the interior of the layer stack have recently gained more and more in significance for integrating passive electrical components such as capacitors and resistors, and/or active electrical components such as semiconductor chips, in the interior of a printed circuit board of the so-called multilayer type. The multilayer structure comprises a layer stack made from a number of electrically insulating or dielectric layers lying one above another, for example made from a prepreg resin material, with interposed electrical conductor structure planes that include suitable substrates with applied conductor track structures. The layer stack is completed, for example, by lamination or pressing with the use of dielectric prepreg layers, at least some of the layers laid one above another being provided on one or both sides with an electrically conducting layer that is structured into a desired electrical conductor pattern before the layers are laid one above another to form the layer stack. To this end, use is frequently made of an epoxy resin as substrate material with a copper cladding for so-called inner plies, that is to say layers located in the interior of the layer stack and provided with conductor track structures. In order to structure the so-called outer plies, that is to say the external layers provided with conductor track structures, a copper foil is mostly laid onto a dielectric prepreg layer and is firmly connected to the prepreg layer by the pressing operation.

In order to integrate an active and/or passive electrical component into a printed circuit board in such a way, it is known to fix such a component in a region free of conductor tracks on an electrically insulating base layer provided with conductor tracks, before one or more further layers are then applied to complete the layer stack, and the overall structure is laminated together and pressed. It is customary in this case for there to adjoin the base layer carrying the component a next dielectric layer that is of full-area design or is provided in the region of the electrical component with a window or cutout region. In the present context, a window is understood as an opening completely penetrating the relevant layer, whereas a cutout is understood as a recess formed on one side only in the relevant layer at a depth smaller than the layer thickness. Terminal contact pads of the electrical component are contact-connected to conductor structures on the base layer, or to conductor structures in other planes of the layer stack with the aid of vias, which are also to be understood for the sake of simplicity in the present context as blind hole contacts that end on the contact pads. Alternatively, the electrical component is fixed on the base layer in an electrical contacting region thereof and electrically connected directly to conductor structures there. Multilayer printed circuit board structures of these various types are described, for example, in laid-open patent application DE 196 27 543 A1, patent EP 1 230 680 B1 and the journal article W. Bauer and S. Purger, Integration aktiver und passiver Bauelemente in die Leiterplatte—Alles inklusive—[Integration of active and passive components in the printed circuit board—including all—], EPP November 2003, page 48.

German laid-open patent application DE 31 25 518 A1 describes a thin wiring arrangement for connecting electrical components to an external circuit that comprises a substrate for holding the electrical component, a first insulating layer, arranged on the substrate and made from an organic material, a wiring that is constructed on the first insulating layer and is connected to the electrical component, a second insulating layer, arranged on the first insulating layer and made from an organic material, and terminals, arranged on the first insulating layer, which lie exposed in the second insulating layer and are connected to the wiring. The substrate used is a metallic or ceramic substrate having a cutout in which the electrical component is held. The wiring constructed on the first insulating layer makes contact with terminals provided on the top side of the electrical component. In an embodiment described with reference to U.S. Pat. No. 3,763,404, the wiring for the component is formed on a top side of a flexible wiring substrate that is provided with a window region for making contact with the electrical component arranged underneath the level of the wiring substrate, that is to say terminal structures of the wiring are guided through the window region to the top-side terminal pads of the component. This contacting of the component is simultaneously used for mechanical preassembly of the component on the wiring, that is to say wiring substrate, wiring and component are, for example, prefabricated by means of a continuous tape band process.

Patent DE 690 31 350 T2 discloses an electronic multilayer package having a multilayer ceramic substrate that consists of a multiplicity of insulating and signal/reference voltage layers lying one above another, and which includes on its top side one or more cutouts for holding one or more semiconductor chips arranged next to one another. The chip(s) located in the respective cutout is/are seated there on a binder layer that is formed on the bottom of the cutout and, for example, is formed from a eutectic gold alloy or an epoxy or polyimide material. In the case of a number of chips that are to be placed in a cutout, these form part of a chip structure that is introduced into the cutout and additionally includes above the chips intermediate and innerchip wiring planes that consist of multiple line/metal interconnections and insulating plies interposed therebetween. A multilayer thin film structure made from a multiplicity of insulating layers and metallization layers is applied to the substrate top side provided with the chip(s) introduced, the metallization layers being electrically connected by vias to top-side terminal pads of the respective chip or to the intermediate and innerchip wiring planes of the chip structure.

U.S. Pat. No. 5,401,688 discloses a multilayer printed circuit board structure comprising a layer stack made from a number of layers provided with conductor track structures and in which at least one semiconductor chip is embedded between two of these layers. In the lamination process of the multiply multilayer printed circuit board structure, electrical contact is made between bump terminal pads of the chip and conductor structures of the neighboring layer that are aligned therewith.

SUMMARY OF THE INVENTION

As a technical problem, the invention is based on providing a multilayer printed circuit board structure of the type mentioned at the beginning, and an associated production method, which enable one or more electrical components to be integrated in the interior of the multilayer structure with a relatively low outlay and high functional reliability.

The invention solves this problem by providing a multilayer printed circuit board structure having the features and a production method as described herein.

In the multilayer printed circuit board structure according to the invention, the insert, having an inferior slight surface extent in relation to the layer stack, is completely embedded on all sides, including laterally, specifically by two covering prepreg or liquid resin layers, a prepreg or liquid resin base layer, on the one hand, and a prepreg or liquid resin covering ply layer, on the other hand, and by resin material that liquefies upon compression or lamination of the structure into prepreg or liquid resin layer regions adjacent to the insert, and thereby fills in or fills up gaps or interspaces between the insert and neighboring regions of the layer stack. The insert can thereby be embedded completely and without a gap in a homogeneous resin environmental step.

It goes without saying that after the compression or lamination of the structure the liquid resin or prepreg layers used in the layer stack form appropriately cured, electrically insulating or dielectric layers, as is familiar to the person skilled in the art. For the sake of clarity, these layers also continue to be denoted as liquid resin or prepreg layers in the present context in their finished, cured state.

In a development of the invention as, at least one of the two liquid resin or prepreg layers covering the insert has a cutout in which the insert or the component or components mounted on it find space, that is to say can be held with at least a portion of their height extent. This can facilitate the holding of inserts or components having a somewhat greater height, but it is also advantageous precisely for sensitive inserts or components of small thickness, for the purpose of providing these with a mechanical pressure relief during the pressing/laminating operation.

In a further advantageous development of the invention, provided between the two liquid resin or prepreg layers covering the insert is a liquid resin or prepreg intermediate layer that has a window in the region of the insert or at least of one component mounted on it. This variant implementation of the invention can also be advantageous, in particular, for inserts and electrical components, mounted thereon, of relatively large height, for example when the latter is of the order of magnitude of the typical layer thicknesses of the individual layers of the layer stack, but also for thin, pressure-sensitive inserts and electrical components mounted thereon. The intermediate layer avoids relatively strong arching of the covering liquid resin or prepreg layers in the case of a relatively high insert and/or electrical component mounted thereon, and ensures pressure relief during compression of the structure in the case of thin pressure-sensitive inserts and/or components mounted thereon. Embedding the insert completely and without a gap into the adjacent resin material liquefied during compression or lamination of the structure continues to be ensured, said resin material also being able in this case to originate at least partially from the intermediate layer.

In a development of the invention as, the two liquid resin or prepreg layers covering the insert, and/or the liquid resin or prepreg intermediate layer are formed in the multiply fashion and in this case include at least two liquid resin or prepreg layer plies. Depending on the particular case, here the intermediate layer can also constitute a liquid resin or prepreg layer ply of one of the two liquid resin or prepreg layers covering the insert. In the case of a multiply structure, a cutout in one of the two liquid resin or prepreg layers can be implemented in the region of the insert or of a component mounted thereon by virtue of the fact that, for example, at least one of the layer plies on the side, facing the insert, of the relevant liquid resin or prepreg layer is provided with a window. A subsequent, continuous layer ply then terminates the holding space formed by the window in the layer stacking direction. If required, a cutout can optionally further additionally be provided in this covering layer ply.

In a development of the invention, located between the two liquid resin or prepreg layers covering the insert is at least one layer that is provided with conductor track structures, that is to say an inner ply, and has a window in the region of the insert or of the component or components mounted on it. In other words, in this exemplary embodiment the holding space for the insert and the relevant component extends through an inner ply, as a result of which inserts and components mounted thereon that are of comparatively large height can advantageously be integrated into the layer stack too. Embedding without a gap in resin material from adjacent liquid resin or prepreg layer regions is also obtained in this exemplary embodiment, and in this case the resin material, liquefied during compression or lamination of the structure, from adjacent liquid resin or prepreg layer regions also completely fills up any lateral gap between this inner ply and the insert and the component mounted thereon.

In a development of the invention, the at least one electrical component is mounted on a component mounting site of a rewiring substrate of the insert on which the rewiring is also provided, the latter being located, in a further refinement in accordance with claim 7, on the same side of this layer as the component mounting site. The insert is located in the interior of the layer stack and extends laterally only in a subregion of the surface extent of the layer stack. In other words, in this case the electrical component is a constituent of an insert that is integrated in the interior of the layer stack and includes a substrate with a rewiring function for the electrical component. In an advantageous refinement, it is possible in accordance with claim 8 to provide component insertion on both sides with associated rewiring for the insert in each case, vias ensuring electrical contact between the two rewirings.

The invention enables an advantageous preassembly of the electrical component on the rewiring substrate, and an electrical testing of the insert, that is to say, in particular, of the electrical component and its rewiring, before installation in the layer stack. This ensures that the insert is loaded only with functional electrical components, and that only inserts loaded faultlessly and operating properly are introduced into the multilayer structure. The rewiring permits a coarsening of terminal structures for the contact between the component(s) and conductor structures of the layer stack or to the outside, that is to say corresponding contact areas can be larger and/or can be arranged at a greater spacing from one another than the terminal contacts respectively present directly at the component. This reduces the requirements with regard to placement accuracy for blind hole contacts or vias to be introduced. Since the rewiring is implemented on the insert, it need not be produced on one of the conductor planes of the layer stack, and the respective electrical component need not be positioned with high accuracy on such a conductor structure plane at an appropriate site, and this reduces the outlay on fabrication and raises the functional reliability.

The implementation of the rewiring on the insert integrated into the interior of the multilayer printed circuit board structure, and specifically on the chip mounting side of the rewiring layer has the further advantage that it is possible to reduce the space requirement on the outer ply/plies of the multilayer structure, since there is a further need only to guide the corresponding vias onto the surface of the multilayer structure. In addition, routing of the outer plies is simplified, since the position of the rewiring contact pads on the rewiring substrate can be selected such that the associated vias to the outer plies can be placed at a site favorable for the routing of the outer plies.

Since the insert or the rewiring substrate thereof extends only over a lateral subregion of the layer stack, delamination problems are prevented even when the adhesiveness of, for example, a rewiring substrate made from polyimide to a prepreg material of the adjacent base layer should not be particularly high.

The rewiring substrate can, for example, be implemented as a flexible, thin layer with interposer action. This measure contributes to keeping low mechanical stresses that are caused by thermal expansion effects. This is particularly important when significant temperature changes occur in the layer stack during operation or further processing.

In an advantageous development of the invention, the rewiring substrate consists of a flexible printed circuit board material such as a liquid crystal polymer (LCP) or polyimide material, or a ceramic material, and it has in a middle region a component mounting site for the electrical component(s) to be mounted and, in a peripheral region, rewiring contact pads that are electrically connected to the component mounting site via associated conductor tracks. Placing the component(s) in the middle on the rewiring substrate likewise contributes to the compensation of thermal expansion forces, since lateral tensile and compressive forces are very largely cancelled in this way. The rewiring from the middle component mounting site to the peripheral substrate region additionally produces a coarsening of the terminal structure of the component, since there is more space available for contact pads in the peripheral region.

In a development of the invention, a respective buffer layer portion is provided between the insert, on the one hand, and at least one of the liquid resin or prepreg layers functioning as base layer or cover layer, respectively, and covering the insert on both sides, this buffer layer portion extending only over a lateral subarea of the layer stack, preferably, however, at least greater than the insert, and can be selected with regard to material and layer thickness such that, for example, it mediates between the thermal expansion coefficient of the rewiring substrate of the insert and that of the base layer or cover layer, and/or can absorb mechanical stresses and/or is able to electrically insulate conductor structures at a surface, opposite the insert, of the base layer or the cover layer from the insert.

In a development of the invention, there is provided on the rewiring substrate in a region laterally outside the mounted electrical component(s) a height spacer structure that extends in the stacking direction as far as the mounted electrical component(s) or beyond the latter. The height spacer structure can thereby relieve the mounted electrical component(s) of pressure forces acting during compression of the multilayer structure.

In a development of the invention, the insert additionally includes a fill and/or planarizing layer that extends over the full area of the rewiring substrate or only in the region outside the electrical component(s). The latter is able, if required, to compensate relatively large height differences of the insert on the basis of the component(s) applied, or to fill up lateral clearances. In particular, given the presence of the height spacer structure this layer is also able to fill up clearances between this structure and the mounted electrical component(s).

In a refinement of this measure, the fill and/or planarizing layer consists of a thermally conductive, but electrically insulating material. This enables heat to be dissipated from the electrical component(s) if required.

In a further refinement of the measure of providing a fill and/or planarizing layer made from thermally conductive material, the insert comprises a heat conducting layer over the fill and/or planarizing layer in thermal contact therewith. Consequently, for example, heat developed by the mounted electrical component(s) can be effectively dissipated or distributed via the fill and/or the planarizing layer and the heat conducting layer lying thereover.

In a further refinement, the insert has a cover layer over the fill and/or planarizing layer or the heat conducting layer, the cover layer being selected with regard to material and/or size to be similar to the rewiring substrate in the lateral direction and stacking direction. Consequently, the insert is provided with a comparatively symmetrical layer structure, and this likewise contributes to keeping low mechanical stresses based on expansion effects, and to minimizing bending stresses.

In a further refinement, the heat conducting layer of the insert, and/or at least one of the rewiring contact pads are/is connected in a thermally conducting fashion through one or more vias to at least one thermally conductive, structured or full-area layer of the layer stack such that heat can be distributed away from the insert into the layer stack and, if appropriate, be dissipated to the outside.

In a development of the invention, the two liquid resin or prepreg layers covering the insert are arranged approximately in the middle of the layer stack in the stacking direction such that the insert correspondingly also lies approximately in the middle in the layer stack in the stacking direction.

The method enables an multilayer printed circuit board structure according to the invention to be fabricated with a relatively low outlay, it being possible to embed the insert in resin material completely and without a gap.

In a method developed, vias guided through the rewiring substrate of the insert are introduced advantageously such that the electrical via material does not make contact with the material of the rewiring substrate, but with an intermediate resin material. This can improve the reliability of the vias.

In an advantageous refinement, rewiring conductor tracks are formed by separation trench structuring of an electrically conducting rewiring layer applied to the full area of the rewiring substrate of the insert. Owing to this measure, the greater part of the full-area, preferably metallic rewiring layer remains on the substrate, and this can likewise contribute to diminishing problems of thermal expansion. Moreover, substances that promote adhesion relatively easily can be applied to the rewiring layer which, for example, consists of Cu, in the event of which it is possible to improve the adhesion of the insert in the overall assembly and, specifically, to an adjacent prepreg cover layer.

BRIEF DESCRIPTION OF THE DRAWINGS

Advantageous embodiments of the invention are illustrated in the drawings and explained below.

FIG. 1 shows a diagrammatic plan view of a subregion of a base layer of a multilayer printed circuit board structure with an applied insert that has a mounted electrical component and an associated rewiring.

FIG. 2 shows a sectional view along a line II-II of FIG. 1.

FIG. 3 shows a longitudinal sectional view of a multilayer printed circuit board structure in a subregion with integrated insert in the manner of FIGS. 1 and 2, and blind hole vias.

FIG. 3a shows a longitudinal sectional view corresponding to FIG. 3 for a variant with underfilling, effected at the rear, of the electrical component mounted on the insert.

FIG. 3b shows a longitudinal sectional view corresponding to FIG. 3 for a variant with an insert loaded with components on both sides.

FIG. 9 shows a longitudinal sectional view of a multilayer printed circuit board structure in a subregion with integrated insert and electrical component mounted thereon and projecting into an inner ply window.

DETAILED DESCRIPTION OF THE INVENTION

Figure 4:
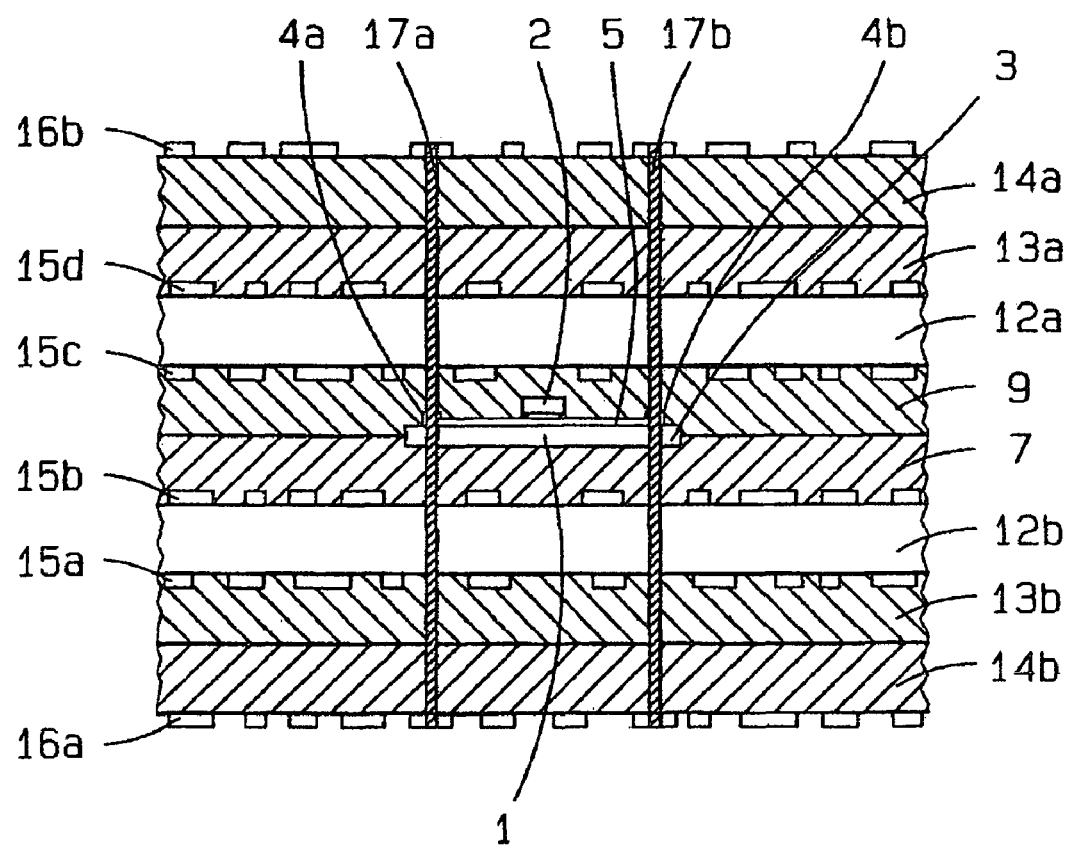
FIG. 4 shows a longitudinal sectional view similar to FIG. 3 for a variant with additional layers and continuous vias.

FIGS. 1 and 2 illustrate an insert 1 for the integration of an active electrical component 2, for example in the form of a chip, in a multilayer printed circuit board structure. The insert 1 includes a rewiring substrate 3 with rewiring applied thereto and consisting of rewiring contact pads 4 and rewiring conductor tracks 5 for electrically connecting the rewiring contact pads 4 to one terminal lead 6 each, that is to say terminal pad, of the chip 2. The rewiring substrate 3 consists, for example, of a flexible printed circuit board material such as an LCP material or a polyimide film material with a thickness of, for example, 25 μm to 50 μm, or an FR4 material with a thickness of, for example, 100 μm. Alternatively, it is also possible to use a conventional ceramic material. In general, it is advantageous to make use for the rewiring substrate 3 of material whose coefficients of thermal expansion are adapted to the material of an adjacent layer, and/or can absorb mechanical stresses in order to keep mechanical stress loads as low as possible for the insert 1.

As may be seen from the plan view of FIG. 1, the chip 2 is fitted on an associated component mounting site in the middle region of the rewiring substrate 3, and thus of the insert 1. Alternatively, an eccentric chip mounting on the rewiring substrate 3 is also possible, but the middle positioning shown, which is thus symmetrical with reference to the lateral surface extent of the insert, is generally advantageous with regard to minimizing force loads owing to mechanical stresses and/or thermal expansion effects during operational use. The chip mounting can be performed by any desired conventional technique, for example a flip chip mounting technique as indicated in FIG. 2, which then preferably includes an underfill material 8 in the interspace between chip 2 and redistribution substrate. The chip 2 is fixed by means of connecting techniques known per se for this purpose, for example by thermobonding as represented by associated bonding sites at the chip terminals 6.

As is likewise to be seen from the plan view of FIG. 1, the rewiring contact pads 4 are arranged in a peripheral region on the rewiring substrate 3. Since there is more space available in this peripheral region of substantially greater area as compared to the middle component mounting site, the rewiring 4, 5 simultaneously fulfills a terminal coarsening function, that is to say the rewiring contact pads 4 corresponding in number to the chip terminal leads 6 can be arranged with a greater contact pad extent and/or larger spacing from one another than the chip terminal leads 6, and this facilitates making further contact with the chip 2 via the rewiring contact pads 4 with other electrically conductive structures and/or components of the multilayer printed circuit board structure and/or starting from the latter. The rewiring contact pads 4 can be fabricated in a way known per se together with the rewiring conductor tracks 5.

It goes without saying that it is also possible in alternative embodiments to provide another active or passive electrical component or a number of passive and/or active electrical components on an appropriately modified insert rewiring substrate at one associated component mounting site each. Here, the term component mounting site signifies merely that the relevant electrical component is to be placed there. This can be performed by separately prefabricating the component and then bringing it to the component mounting site and fixing it there, but alternatively the component can also be fabricated directly at the component mounting site for example as integrated semiconductor component structure and/or by screen printing or photolithographic processes.

In the example shown in FIGS. 1 and 2, the rewiring conductor tracks 5 consist of narrow wiring paths on the rewiring substrate 3 that are formed by one of the processes currently used for this purpose. In an alternative embodiment, the conductor tracks that connect the chip terminal pads 6 to the rewiring contact pads 4 are formed by broad, flat regions of an electrically conducting layer that is applied over the full area of the rewiring substrate 3 and then split up by a separation trench process into surface regions separated from one another by a respective separation trench. The course of the separation trenches is selected such that each of these surface regions comprises one of the chip terminal pads 6 and the associated rewiring contact pad 4, and thereby constitutes the associated, connecting, flat conductor track thereof. This design variant has the advantage that the entire top side of the rewiring substrate 3 on the chip side remains covered up to the region of the chip 2 and of the separation trenches by the rewiring layer that consists, for example, of Cu, the result being, firstly, that thermal expansion effects of the rewiring substrate 3 can be attenuated and, secondly, as required that an adhesion promoter can be applied to the rewiring layer in order to improve the adhesion of a subsequent layer ply of the multilayer printed circuit board structure, and to suppress any risk of delamination in the region of the insert 1. The structuring of the narrow wiring paths 5 or, alternatively, of the flat conductor tracks is performed, for example, by means of currently used methods of photolithography or laser structuring.

It is advantageous to select a material that is a good conductor of heat, such as Cu, for the electrically conducting rewiring layer, since it can then additionally fulfill a heat dissipating and/or heat distributing function in order to prevent instances of overheating in the region of the applied chip 2 during operational use.

In an embodiment that is not shown, electromagnetic shielding of the rewiring layer or of the rewiring 4, 5 formed from it is effected by providing over (or above) said rewiring and/or between the latter and the rewiring substrate 3 with the interposition of an electrically insulating layer a shielding layer in the form, for example, of a full-area, preferably metallic ground potential layer.

For the purpose of integration into a multilayer printed circuit board structure, the insert 1 prefabricated as explained above is then firstly fixed with the underside of its rewiring substrate 3 on a base layer 7 at a desired site with the correct coordinates in the lateral xy-direction. The fixing can be performed, for example, by means of one or more adhesive dots or a flat adhesive connection or by means of applying heat to the rewiring substrate 3 itself and/or to the region of the base layer 7 that is to be brought into contact with said rewiring substrate. The base layer 7 constitutes a full-area, electrically insulating dielectric layer of the multilayer printed circuit board structure that is to be fabricated, and consists of a prepreg resin material or a liquid resin material. Said application of heat then leads to a partial melting, adhesion and curing of the prepreg base layer 7 in the region of the mounted insert 1, the result being to fix the latter.

Depending on the respective application, the base layer 7 can be an outer or inner layer of the layer stack, to be formed from a number of layers, of the respectively desired multilayer printed circuit board structure. In the latter case, one or more further layer plies are located on the side of the base layer 7 averted from the insert 1, the base layer 7 with the insert 1 fixed thereon being attached to this one or more further layer plies or, alternatively, firstly the base layer 7 alone is attached to this one or more further layer plies and then insert 1 is fixed thereon.

The further fabrication of the multilayer printed circuit board structure includes the application of a full-area cover layer to the side of the base layer 7 provided with the attached insert 1, accompanied by covering of the insert 1 such that the latter lies between the base layer 7 and the covering ply layer in the interior of the layer stack of the multilayer printed circuit board structure. When the covering ply layer does not constitute an outer layer ply of the multilayer printed circuit board structure, one or more further layer plies are attached to said covering ply layer, and after all layer plies provided for the layer stack have been laid one on the other the layer stack is compressed or laminated together as a layer packet in a conventional way in order to form the desired multilayer printed circuit board structure.

A few specific examples of the inventive integration of such and similar inserts loaded with one or more active and/or passive electrical components into the interior of a multilayer printed circuit board structure are explained in more detail below with reference to FIGS. 3 to 9. In this case, for the sake of clarity and of better understanding not only identical elements, but also elements of equivalent function in the various exemplary embodiments are marked with the same reference numeral in each case in FIGS. 1 to 9.

FIG. 3 shows an essentially two-ply printed circuit board structure comprising two outer plies 7, 9 without inner ply, in which case proceeding from the structure of FIGS. 1 and 2 the dielectric base layer 7 forms a first outer ply, and a cover layer 9 applied to the latter and to the interposed insert 1 forms a second outer ply. The base layer 7 and the cover layer 9 are respectively provided on the outside with an electrical conductor structure plane 10, 11, that is to say a structured electrical conductor plane, of conventional type, and preferably consist of a prepreg resin material. The insert 1 with its rewiring substrate 3, the chip 2 mounted thereon and the associated rewiring 4, 5 is embedded without a gap or cavity between the base layer 7 and the cover layer 9 in the resin material thereof. To the outside, the chip 2 makes contact via the rewiring 4, 5 and blind hole contacts 12 with structural elements of the conductor plane 11 on the cover layer 9, the vias 12 respectively connecting one of the rewiring contact pads 4 to the associated structural element of the conductor plane 11 through the dielectric cover layer 9.

As explained above in relation to FIGS. 1 and 2, in order to produce the multilayer printed circuit board structure of FIG. 3 the insert 1 is firstly prefabricated and fixed at the desired site on the prepreg substrate 7. Subsequently, the prepreg cover layer 9 is attached to the prepreg substrate 7 with the insert 1 fixed thereon. For the two layers 7, 9, use may be made as starting material for this structure of, for example, prepreg layers that are provided with attached copper foils that are subsequently structured in order to form the conductor structure planes 10, 11.

Subsequently, the layer packet formed is compressed and laminated together in the usual way to form the layer stack overall assembly with the aim of finishing the desired multilayer printed circuit board structure. The insert 1 is thereby embedded without a gap and without a cavity in resin material that fuses owing to the squeezing pressure, or is held between the prepreg substrate 7 and the prepreg covering ply 9 with the latter being appropriately pressed in. Since, in this exemplary embodiment, the height of the insert 1 including the component 2 mounted thereon is relatively slight, in particular much smaller than the layer thickness of the adjacent liquid resin or prepreg layers 7, 9, the embedding of the insert does not produce a marked arching of the covering liquid resin or prepreg layers 7, 9. Alternatively, it is possible to provide in the base layer 7 and/or in the cover layer 9 a cutout in the region of the insert 1, or at least of the component 2 mounted on it, in order to create corresponding space for holding the insert 1 or the component 2. The structuring of the outer conductor planes 10, 11 is carried out by using this pressing/lamination operation, for example by means of a conventional lithography or laser structuring process.

FIG. 3a shows a variant of the exemplary embodiment of FIG. 3, in the case of which there is provided a rear side or underside filling of the chip 2 mounted by using flip chip technology, which filling is raised above the chip terminal pads 6 and seated above the rewiring substrate 3. Located in the interspace between the chip 2 and the rewiring substrate 3 or the rewiring 4, 5 in this example is an underfill material 8a that is introduced from below via an underfill opening 8b correspondingly introduced into the insert 1. This is advantageously a resin material that liquefies in the base layer 7 upon compression or lamination of the structure, and is pressed upward through the underfill opening 8b and fills up without cavities the interspace there between the chip 2 and the part, lying thereunder, of the rewiring substrate 3 or the rewiring 4, 5. Otherwise, the exemplary embodiment of FIG. 3a corresponds to that of FIG. 3. In particular, the underfilling prevents the formation of air inclusions that could lead to delamination effects.

FIG. 3b shows a modification of the exemplary embodiment of FIG. 3, in the case of which the insert 1 embedded without cavities in the resin material between the base layer 7 and the cover layer 9 is loaded with components on both sides. Shown by way of example apart from the chip 2 mounted on the top side are components mounted on the underside, specifically, for example, a further chip 2a, an electrical resistor 2b and a capacitor element 2c or other active or passive electrical components. The electrical components 2a, 2b, 2c mounted on the underside are coupled to a rear side rewiring with contact pads 4' and rewiring conductors tracks 5a, and the rear side rewiring 4', 5a is electrically connected to the top side rewiring 4, 5 through vias 12a that extend through the insert 1. Otherwise, this variant again corresponds to the exemplary embodiment of FIG. 3, and so reference may be made to the above statements in this regard.

FIG. 4 shows a further modification of the integration of the insert 1 into the interior of a multilayer printed circuit board structure that has additional inner plies 12a, 12b by comparison with the printed circuit board structure of FIG. 3. Specifically, as in the case of FIG. 3, the insert 1 in the example in FIG. 4 is embedded between the base layer 7 and the cover layer 9, but here they form inner dielectric layers of the multilayer printed circuit board structure. Adjoining these on both sides in each case is an inner ply in the form of a prefabricated semifinished printed circuit board 12a, 12b and in each case two further prepreg layer plies 13a, 13b and 14a, 14b for the purpose of completing the associated layer stack. An inner conductor structure plane 15a to 15d is formed in each case on both sides of each of the two semifinished printed circuit boards 12a, 12b, and is embedded in the resin material of the adjacent prepreg layer ply. The two outer prepreg layer plies 14a, 14b each carry an external conductor structure plane 16a, 16b on the outside. By way of example, the usual approach to producing the external conductor structure planes 16a, 16b is to use copper-clad dielectric layer material for the outer plies 14a, 14b, and to structure the external, full-area copper layer ply by means of conventional techniques after the compression of the layer stack.

In order to produce the structure of FIG. 4, the lower layer plies down to and including the base layer 7 are firstly laid one on top of another, and the insert 1 is fixed on the base layer 7. The cover layer 9 is then mounted. Subsequently, the further layer plies are mounted in order to form a corresponding layer pack that is then laminated together or compressed, as a result of which the insert 1 is also embedded securely in the resin compound between the prepreg substrate 7 and the prepreg covering ply 9.

After the production of the compressed layer stack overall assembly, contact is made in the usual way between the various conductor structure planes 15a to 16b and the chip 2 on the insert 1 by introducing appropriate vias. For example, the sectional view of FIG. 4 shows two vias 17a, 17b that extend between associated structural elements of the two outer conductor structure planes 16a, 16b through the entire layer stack and simultaneously make contact with associated rewiring contact pads 4a, 4b and consequently connect associated terminals of the chip 2 electrically to the outside, for example for the purpose of supplying power or of grounding. Using a conventional technique, the vias 17a, 17b are produced by introducing corresponding via holes and introducing electrically conductive material into the same, for example by plating, it also being possible, if required, to increase the thickness of the external conductor structures 16a, 16b in the same operation. Alternatively, making contact between the chip 2 and the outside via the rewiring contact pads can also be performed by introducing blind hole contacts reaching up to the rewiring contact pads.

FIG. 4 thus shows an embodiment in which the base layer 7 and the cover layer 9 and, consequently, also the insert 1, embedded between these and having the chip 2 mounted thereon, are located in the middle of the printed circuit board layer stack seen in the stacking direction.

Figure 5:
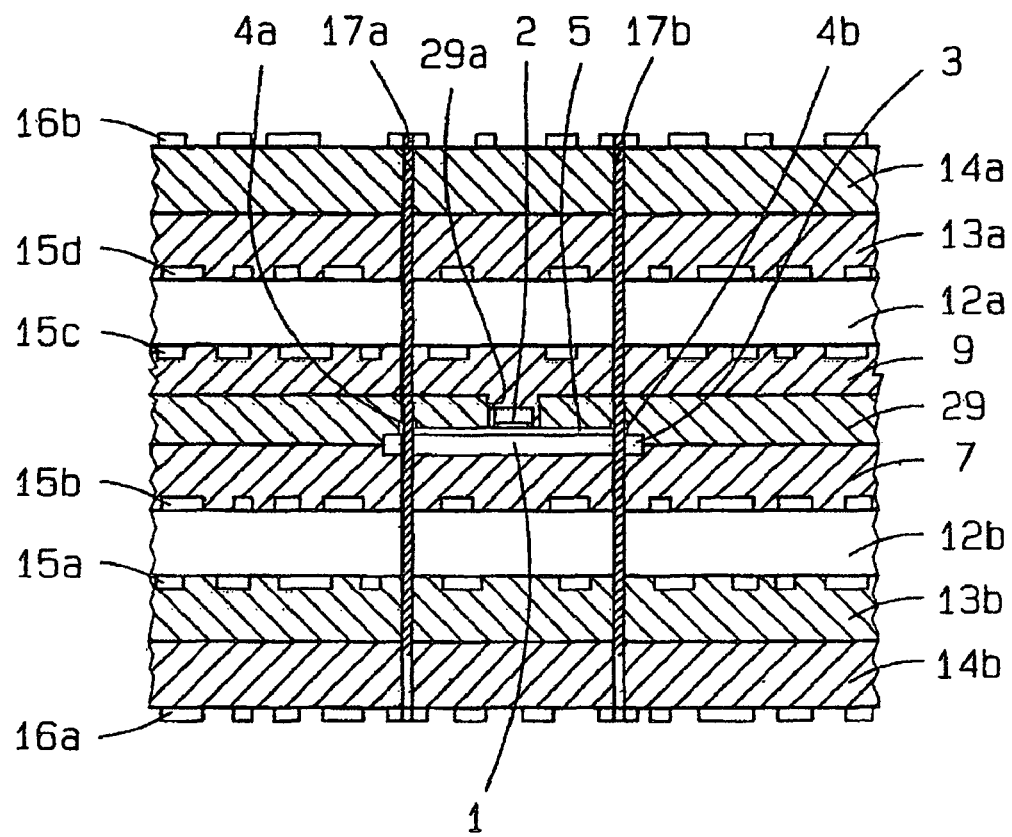
FIG. 5 shows a longitudinal sectional view corresponding to FIG. 4 for a variant with additional liquid resin or prepreg intermediate layer with component window.

FIG. 5 illustrates a notification of the exemplary embodiment of FIG. 4, in the case of which the sole significant difference is the provision of an additional liquid resin or prepreg intermediate layer 29 in the stack layer structure between the base layer 7 and the cover layer 9. As is shown, in the region of the electrical component 2 mounted on the insert 1 this intermediate layer 29 is provided with a window region 29a into which the component 2 projects. Upon compression or lamination of the structure, the resin material of the liquid resin or prepreg intermediate layer 29 is also liquefied and contributes to surrounding the insert 1, together with the mounted component 2, completely and without gaps. The intermediate layer 29 with the window 29a ensures mounting space for the chip 2 mounted on the insert 1, and thus facilitates the homogeneous embedding of the insert without gaps between the two upper and lower covering liquid resin or prepreg layers 7, 9 without the latter in this case undergoing noticeable warping in the region of the insert 1. Moreover, the intermediate layer 29 ensures the chip 2 is relieved of the mechanical compressive loads acting during compression and/or lamination, and this is particularly advantageous for relatively thin, pressure-sensitive chips.

It goes without saying that the intermediate layer 29 can also constitute a layer ply of a multiply cover layer consisting of the covering ply 9 and the intermediate layer ply 29, in which case then at least the intermediate layer 29 that lies on the side of this multiply cover layer that faces the insert 1 is provided in this multiply cover layer with the window 29a. Alternatively, the window 29a can, if necessary, also extend over the entire region of the insert 1 when the latter requires additional mounting space overall.

Figure 6:
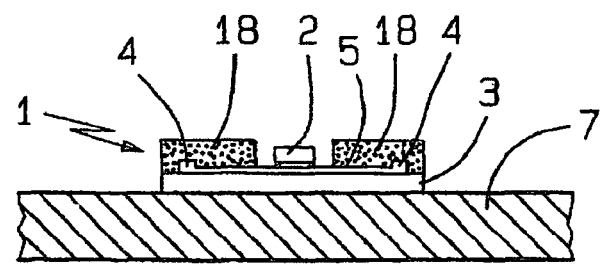
FIG. 6 shows a longitudinal sectional view similar to FIG. 2 for an insert variant with height spacer structure.

FIG. 6 shows a notification or variant with regard to the configuration of the insert 1. Starting from the example of FIGS. 1 to 4, the insert 1 of FIG. 5 additionally has a structured height spacer layer 18 over the rewiring substrate 3 and the rewiring 4, 5 in the region outside the mounted chip 2 and at a somewhat lateral spacing from the latter. Depending on requirement, the height spacer layer 18 can be applied before or after the placement of the insert 1 on the base layer 7. The height spacer layer 18 extends from the rewiring substrate 3 or the rewiring 4, 5 up to at least the top side of the mounted chip 2—somewhat beyond that in the example of FIG. 5, as shown. The height spacer layer 18 is capable in this way of relieving the chip 2 of disproportionate compressive loads during compression of the prepared layer stack in the interior of which the insert 1 is integrated. An epoxy resin material, for example, can be used as material for the structured height spacer layer 18 produced, for example, by screen printing technology. Optionally, a recess can be provided in the height spacer layer 18 in the region of the contact pads 4, which can be produced in the conventional way per se in order to avoid subsequent problems with vias and/or to improve the durability of the vias, for example a copper barrel.

Figure 7:
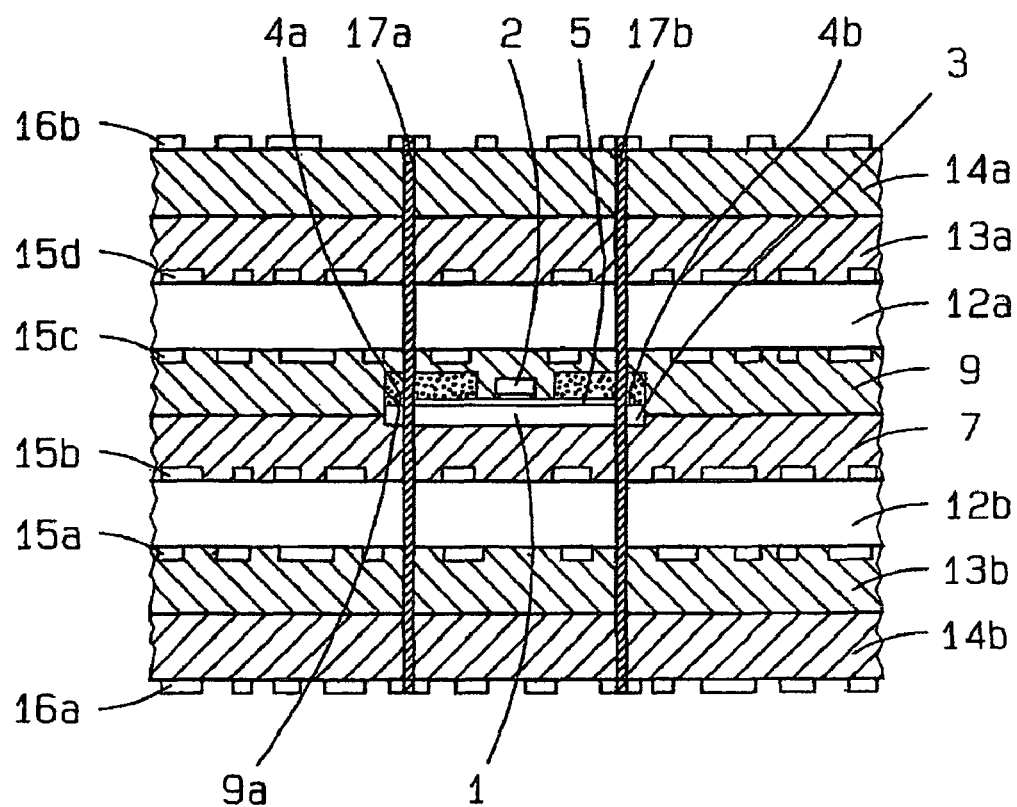
FIG. 7 shows a longitudinal sectional view corresponding to FIG. 4 for a variant with an integrated insert in the manner of FIG. 6.

FIG. 7 illustrates the integration of an insert of the type shown in FIG. 6 into a multilayer printed circuit board structure that otherwise corresponds to that of FIG. 4, and so it is possible to refer to the above description thereof. The cover layer 9 is provided with a suitable cutout 9a for the purpose of more easily holding the insert, which is somewhat thicker in this case. Alternatively or in addition, it is possible to provide a corresponding cutout in the base layer 7.

Figure 8:
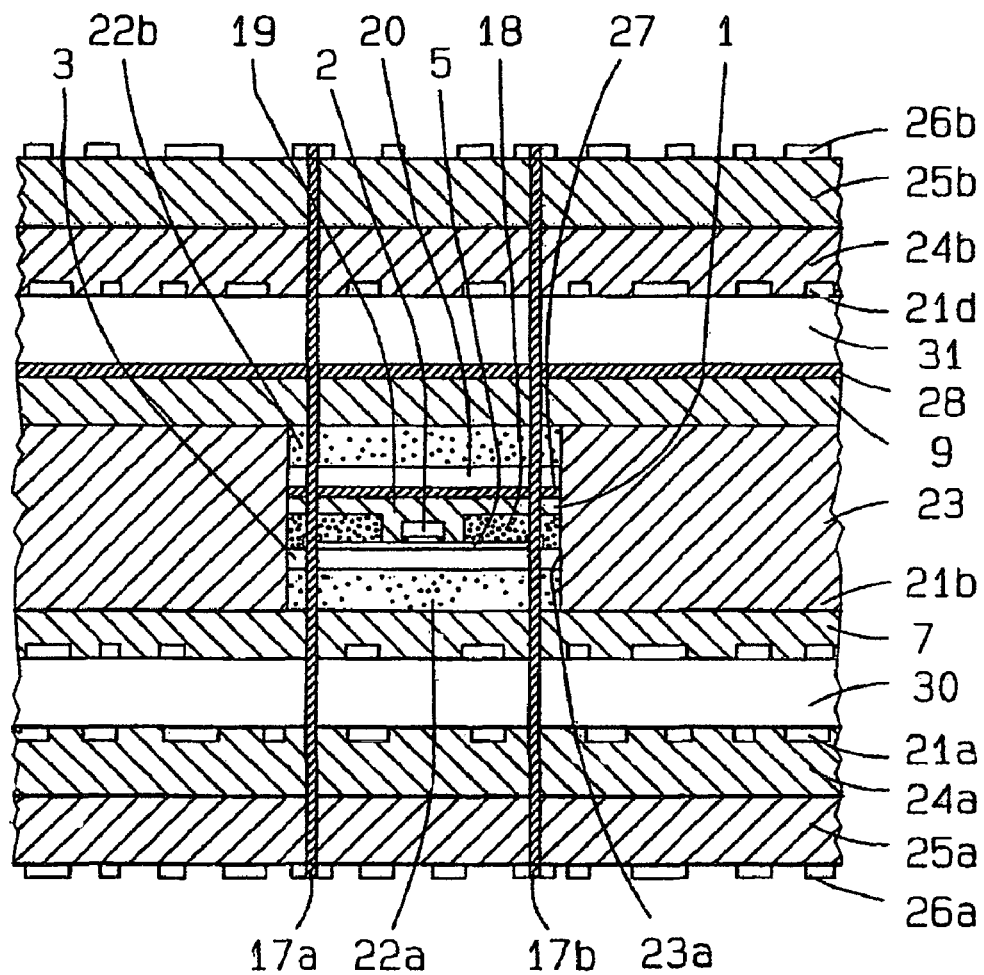
FIG. 8 shows a longitudinal sectional view similar to FIG. 7 for a variant with an insert, modified with regard to heat dissipation, and an additional liquid resin or prepreg intermediate layer.

FIG. 8 illustrates the integration of the insert 1 in accordance with FIG. 6 into a further variant design. Starting from the structure in accordance with FIG. 6, in the example of FIG. 8 the insert 1 further includes a fill/planarizing layer 19 that extends over the height spacer layer 18 and the chip 2, doing so over the full area and with a substantially flat top side and, in the process, also filling up the lateral clearance between the chip 2 and the structured height spacer layer 18. If required, it can be advantageous to use a thermally conductive material for the fill/planarizing layer 19, in order to be able to dissipate or distribute heat from the region of the chip 2.

Applied to the full area of the fill/planarizing layer 19 is an insert cover layer 20 that is identical in material and thickness to the rewiring substrate 3, or alternatively largely corresponds in any case to the latter in thickness and in thermal expansion behavior. Thus, for example, like the rewiring substrate 3 the insert cover layer 20 can consist of a polyimide material or a ceramic material. This designing of the cover layer 20, terminating the insert 1 at the top, to match the rewiring substrate 3 terminating the insert 1 at the bottom results in a relatively symmetrical layer structure of the insert 1, and this can raise the functional reliability and robustness of the insert 1 in relation to thermal loads during the further fabrication of the multilayer printed circuit board structure and in later operation, and in relation to mechanical stress loads caused thereby.

In the exemplary embodiment of FIG. 8, the insert 1 is seated on a buffer layer portion 22*a* that is formed from a material that can compensate mechanical stresses, in particular on the basis of thermal loads, and/or can mediate between the coefficients of thermal expansion of the rewiring substrate 3 of the insert 1 that is adjacent to the top side, and an electrically conducting layer adjoining on the underside. For example, the buffer layer portion can consist of an epoxy resin material. In the present exemplary embodiment, the buffer layer portion 22*a* lies on the base layer 7 which, for its part, lies on an inner ply 30 provided on both sides with conductor track structures. The buffer layer portion 22*a* can, for example, be produced by using screen printing technology, or can be cut out of a corresponding layer material and be mounted and fixed at the relevant site on the base layer 7. During the production of the multilayer printed circuit board structure of FIG. 8, the insert 1 is then fixed with the structure outlined on the buffer layer portion 22*a*. Furthermore, the layer structure of FIG. 8 includes over the base layer 7 a liquid resin or prepreg intermediate layer 23 with a window region 23*a* in which the insert 1 is held together with a buffer layer portion 22*a*. In this example, the window 23*a* is cut out or milled out to the size of the buffer layer portion 22*a* whose lateral dimension corresponds to that of the insert, and the lateral interspace relating to the insert 1 is then filled with fused or flowable resin material upon later compression. This, in turn, enables the homogeneous embedding of the insert 1, which in this case has a noticeable height together with the buffer layer portion 22*a*, in the layer stack structure, in conjunction with gap-free surrounding with resin material from the base layer 7*a*, the cover layer 9*a* and the intermediate layer 23, without there being undesired warping of the base layer 7 and the cover layer 9 in the region of the insert 1.

As explained above in relation to the buffer layer portion 22*a*, it can be advantageous to provide a corresponding buffer layer portion 22*b* as part of the insert 1 between the latter and the cover layer 9, in order to compensate thermal and/or mechanical loads, as likewise illustrated in FIG. 8. Moreover, there is a further contribution to minimizing the force loads for the insert 1 and its chip 2 from the symmetrical arrangement of the upper buffer layer portion 22*b* in relation to the lower buffer layer portion 22*a*, it being preferred to use substantially identical layer thicknesses and materials that are identical or similar with regard to thermal expansion behavior. Moreover, the multilayer printed circuit board structure of FIG. 6 is also in turn overall of a nature largely symmetrical with reference to a stack middle plane, and the insert 1 with the chip 2 lies in the middle region of the multilayer structure when seen in the stacking direction.

In a way similar to the intermediate layer 29 of FIG. 5, it is obvious that the intermediate layer 23 can also constitute a part of a multiply implementation of the base layer 7 or a multiply implementation of the cover layer 9. It is further evident that in this and all other exemplary embodiments shown and described each of the uniformly illustrated liquid resin or prepreg layers that function as base layer and cover layer in order to cover the insert on both sides, that is to say the layers 7 and 9 in this example, and/or to cover the intermediate layer lying therebetween, that is to say the intermediate layer 23 in this example, can respectively be constructed in multiply fashion with at least two liquid resin or prepreg layer plies.

Apart from the lower inner ply or semifinished printed circuit board 30, the variant in accordance with FIG. 8 also has an upper inner ply or upper semifinished printed circuit board 31 with a conductor structure plane 21*d* lying on top. There follow respectively upward and downward a further prepreg ply 24*a*, 24*b* and an external dielectric layer ply 25*a*, 25*b*. The external dielectric layer plies 25*a*, 25*b* respectively carry on the outside an external conductor structure plane 26*a*, 26*b*, to which end they can consist of a prepreg material and a mounted copper foil. Compression of the layer pack connects the copper foil firmly to the prepreg material, and the copper layer formed thereby is structured into the corresponding conductor structure plane 26*a*, 26*b* in the course of standard process steps.

In the case of the variant of FIG. 8, additional heat dissipating measures are provided so as to yield an enhanced heat dissipation function. To this end, the insert 1 has a layer 27 that is highly thermally conductive, for example being made from Cu, between the fill/planarizing layer 19 and the insert cover layer 20. Moreover, an inner conductor structure plane of the upper semifinished printed circuit board 31 is replaced by a full-area heat conducting layer 28 that remains unstructured and can be, for example, simply a copper coating of this semifinished printed circuit board 9*a* that remains unstructured.

As may be seen from a comparison of FIGS. 4 and 8, the layer stack of FIG. 8 corresponds in structure to that of FIG. 4, apart from the modification with regard to the unstructured heat conducting layer 28 and the intermediate layer 23, as well as the modified configuration and embedding of the insert 1. As is further to be seen therefrom, the multilayer printed circuit board structure of FIG. 8 is finished in a similar way by introducing the required vias, the two vias 17*a*, 17*b* corresponding to the example of FIG. 4 being shown by way of example.

In the exemplary embodiment of FIG. 8, these vias 17*a*, 17*b* additionally fulfill a heat transporting function in that they are formed from a material, for example Cu, that is a good conductor of heat. The point is that the associated rewiring contact pads and, above all, also the heat conducting layer 27 of the insert 1 are connected in a thermally conducting fashion to the full-area heat conducting layer 28 of the layer stack through the vias 17*a*, 17*b* such that heat that arises in the region of the chip 2 can be conducted very effectively via the rewiring 4, 5, on the one hand, as well as the fill/planarizing layer 19 and the insert heat conducting layer 27, on the other hand, to the vias 17*a*, 17*b* and be dissipated through these to the full-area thermally conducting layer 28, and be distributed by the latter. This heat dissipation measure can substantially raise the functional reliability of the chip 2 mounted on the embedded insert 1 and of the remaining insert components, particularly in cases when a marked evolution of heat from components of the insert 1 is caused during operation. It goes without saying that vias of equal potential, such as common vias for grounding or supplying power, are respectively suitable for connection to the heat conducting layer 28 of the layer stack in a thermally conducting fashion.

The insert heat conducting layer 27 can be, for example, a layer, made for example from copper, already present on the insert cover layer 20 in a fashion prefabricated from polyimide or the like. In this case, the insert cover layer 20 can be cut out together with the thermally conducting coating 27 from a layer material of larger area, and be mounted with the coating 27 on the fill/planarizing layer 19. Depending on the requirement, this can be performed before the positioning of the insert 1 on the base layer 7, or thereafter.

If desired, it can be provided to guide the vias 17a, 17b through the rewiring substrate 3, for example, polyimide, without touching the material of said rewiring substrate. To this end, bores are then introduced into the rewiring substrate 3 before the embedding of the insert 1 between the base layer 7 and the cover layer 9, doing so with a larger diameter than the subsequent vias. Upon compression of the layer stack, these bores are filled with resin material flowing in from the adjacent resin layer ply. The via holes of smaller diameter introduced through the layer stack after compression of the latter can then run at the height of the rewiring substrate 3 entirely inside the resin filling such that an insulating resin material ring remains between the introduced via material and the material of the rewiring substrate 3.

As a further exemplary embodiment of the invention, FIG. 9 shows a variant of the example of FIG. 5 in which there is additionally provided in an inner ply 32 a window region 32a that is the sole significant difference relating to the holding of the insert 1, in which in this example there is mounted a comparatively thick, for example housed chip 2, or another housed, or for other reasons relatively thick, electrical component. Specifically, this inner ply 32 is located in the interior of a multiply intermediate layer between the base layer 7, on which the insert 1 rests, and the cover ply layer 9. The intermediate layer here includes the liquid resin or prepreg intermediate layer 29 as lower layer ply, the inner ply 32 as middle layer ply, and an upper liquid resin or prepreg layer ply 29b. The window 29a of the lower intermediate layer 29, and the window 32a of the inner ply 32 together form a mounting space. The upper intermediate layer ply 29b ensures that the insert 1 with the chip 2 is covered above with resin.

In the exemplary embodiment of FIG. 9, as well, the insert with the chip 2 is embedded on all sides without a gap in surrounding resin material that in this case originates from the base layer 7, the lower intermediate layer ply 29 and the upper intermediate layer ply 29b, and fills up any gap, above all also between the relatively thick chip 2 and the laterally adjacent window edge regions of the lower intermediate layer ply 29 and the inner ply 32, by virtue of the fact that it is liquefied during compression or lamination of the structure and fills corresponding interspaces.

In the example of FIG. 9 that is shown, the mounting space created by the windows 29a and 32a serves alone for mounting the chip 2. It goes without saying that it is possible as an alternative to provide the windows with lateral dimensions that correspond at least approximately to those of the remaining insert 1, that is to say in particular of the layer structure, lying below the chip 2, with the wiring substrate 3, in order also to mount this part of the insert 1 in a window region when there is a need therefor. This is expedient, in particular, in the case of a relatively high insert layer structure such as, for example, in the case of inserts of the type shown in FIG. 8, specifically when said structure also additionally includes relatively thick mounted components such as, for example, the chip 2 of FIG. 9.

Although it is respectively only an insert having mostly only one mounted electrical component that is integrated in the examples shown into the interior of a multilayer printed circuit board structure, it goes without saying that in alternative embodiments the invention also comprises multilayer printed circuit board structures in which an insert with a number of active and/or passive electrical components provided on it, and/or a number of inserts each having one or more electrical components is/are integrated in the interior of the layer stack. A number of inserts can, for example, be positioned next to one another in the same stack plane at a lateral spacing. In addition or alternatively, a number of inserts can be positioned lying one above another in the stacking direction in various stack planes with or without lateral offset.

The above-described exemplary embodiments reveal that the invention enables a very advantageous integration into the interior of a multilayer printed circuit board structure of one or more inserts each having one or more passive and/or active electrical components on a rewiring substrate, the insert and, in particular, its rewiring substrate being embedded completely and without a gap in the resin material between a base and a covering ply, for example made from prepreg resin material. The structure of the insert and its installation in the layer stack can be implemented upon request with a high degree of symmetry, and this prevents high mechanical stress loads owing to thermal expansion effects in conjunction with significant temperature changes. Since the rewiring substrate of the insert has a substantially smaller surface extent than the embedded layer plies of the printed circuit board layer stack, there is no occurrence of delamination problems such as would possibly be feared given the introduction of a continuous rewiring substrate made, for example, of polyimide. A flexible, thin design of the rewiring substrate can, furthermore, in accordance with an interposer action, contribute to the compensation of occurring tensile and compressive force loads on the basis of different coefficients of thermal expansion of the participating layer materials. Placing the component(s) on the rewiring substrate of the insert substantially in the middle and/or symmetrically likewise contributes to reducing lateral tensile and compressive force loads.

According to the invention, the inventive multilayer printed circuit board structure can be produced relatively easily. The rewiring substrate and the electrical component(s) mounted on it can be electrically tested before the compression of the layer stack, and this reduces the failure rate and improves the yield. It is only electrically functional components that are mounted on the wiring substrate, and only functionally mounted inserts are laid in the layer stack of the multilayer printed circuit board structure and compressed with the latter. In addition, the packing density of the multilayer printed circuit board structure can be raised as a whole owing to the segmented introduction of the rewiring only in the subregion of the layer stack in which the insert is located between the dielectric base layer and the dielectric cover layer. Owing to the inventive rewiring in the interior of the multilayer printed circuit board structure, it is additionally possible to reduce the space required for outer plies, and the routing of the outer plies is simplified, since only corresponding vias are still required to be guided from the rewiring contact pads to the surface, and the position of the rewiring contact pads can be selected such that the associated vias to the outer plies are located at a site that is optimum for the routing of the outer plies.

The invention claimed is:

1. A multilayer printed circuit board structure, comprising:
   a layer stack made from a number of layers that are electrically insulating and provided with conductor track structures, said layer stack having a surface extent;
   an insert in the interior of the layer stack that extends laterally only in a subregion of the surface extent of the layer stack and has at least one passive or active electrical component mounted thereon, and an associated rewiring;
   the insert is embedded between two full-area, electrically insulating liquid resin layers or prepreg layers that cover the insert on both sides, the liquid resin layers or prepreg layers liquefying upon compression or lamination of the layer stack to fill gaps between the insert and neighboring regions of the layer stack to surround the insert on all sides without a gap;
   wherein the liquid resin or prepreg layers form electrically insulating or dielectric layers after compression or lamination.

2. The multilayer printed circuit board structure as claimed in claim 1, wherein at least one of the two liquid resin or prepreg layers covering the insert, and at least one liquid resin or prepreg intermediate layer are formed.

3. The multilayer printed circuit board structure as claimed in claim 1, wherein the respective electrical component is mounted on a component mounting site of a rewiring substrate on which the rewiring is also provided.

4. The multilayer printed circuit board structure as claimed in claim 3, wherein the rewiring is provided on the same side of the rewiring substrate as the component mounting site.

5. The multilayer printed circuit board structure as claimed in claim 3, wherein one rewiring and at least one passive or active electrical component mounted on the insert are provided on both sides of the rewiring substrate.

6. The multilayer printed circuit board structure as claimed in claim 3, wherein the rewiring substrate is formed from a flexible printed circuit board material selected from the group consisting of a liquid crystal polymer material, polyimide material, and a ceramic material, and has the component mounting site for mounting the at least one electrical component in a middle region and rewiring contact points in a peripheral region and rewiring conductor tracks that run between the component mounting site and the rewiring contact points.

7. The multilayer printed circuit board structure as claimed in claim 6, wherein the rewiring includes contact pads and at least one the contact pads is connected in a thermally conductive fashion through one or more vias to at least one thermally conductive, structured or full-area layer of the layer stack.

8. The multilayer printed circuit board structure as claimed in claim 3, wherein a height spacer structure on the rewiring substrate in the region laterally outside the at least one electrical component, the height spacer structure extending in a stacking direction at least as far as the at least one electrical component.

9. The multilayer printed circuit board structure as claimed in claim 3, wherein the insert has a fill and/or planarizing layer that extends over the full area of the rewiring substrate or only in the region outside the electrical component.

10. The multilayer printed circuit board structure as claimed in claim 9, wherein the fill and/or planarizing layer consists of a thermally conductive, electrically insulating material.

11. The multilayer printed circuit board structure as claimed in claim 10, wherein the insert has a heat conducting layer over the fill and/or planarizing layer.

12. The multilayer printed circuit board structure as claimed in claim 11, wherein the heat conducting layer is connected in a thermally conductive fashion through one or more vias to at least one thermally conductive, structured or full-area layer of the layer stack.

13. The multilayer printed circuit board structure as claimed in one claim 9, wherein the insert has a cover layer over the fill and/or planarizing layer or over the heat conducting layer.

14. The multilayer printed circuit board structure as claimed in claim 1, wherein the liquid resin or prepreg layers covering the insert are located approximately in the middle of the layer stack in a stacking direction.

15. The multilayer printed circuit board structure as claimed in claim 1, wherein at least one of the two liquid resin or prepreg layers has a cutout in the region of the insert or at least of one component mounted on it, into which cutout the insert or the component projects.

16. The multilayer printed circuit board structure as claimed in claim 1, wherein between the two liquid resin or prepreg layers there is provided at least one liquid resin or prepreg intermediate layer that has a window in the region of the insert or at least of one component mounted on it.

17. The multilayer printed circuit board structure as claimed in claim 1, wherein located between the two liquid resin or prepreg layers covering the insert is at least one layer that is provided with conductor track structures and has a window in the region of the insert or at least one component mounted on it.

18. The multilayer printed circuit board structure as claimed in claim 1, wherein a respective buffer layer portion is provided between the insert and at least one of the two liquid resin or prepreg layers covering the insert.

19. A method for producing a multilayer printed circuit board structure, the method comprising the steps of:
   providing an insert with an electrical component and associated rewiring;
   arranging the insert on a prepared base layer, and arranging one or more further layers over the base layer and the insert to form a layer stack, a liquid resin or prepreg layer being selected for the base layer and a layer covering the insert on the opposite side; and
   laminating together and/or pressing the layer stack, the liquid resin or prepreg layer liquefying in regions adjacent to the insert and surrounding the insert on all sides without a gap, wherein the liquid resin or prepreg layers form electrically insulating or dielectric layers after the laminating together and/or pressing step.

20. The method as claimed in claim 19, wherein the electrical component is mounted on a rewiring substrate of the insert, and the rewiring substrate is provided before the introduction of the insert into the layer stack with bores which fill with resin material from the surroundings during the subsequent laminating together and/or pressing step, and subsequently vias are produced in the resin-filled bores with diameters smaller than the bores in such a way that a resin material ring remains between the respective via and the neighboring edge of the rewiring substrate.

21. The method as claimed in claim 20, wherein an electrically conducting rewiring layer is applied to the full area of the rewiring substrate, and the rewiring layer is subsequently split up into flat conductor tracks through the formation of separation trenches while retaining a predominant area fraction of the rewiring layer.

22. A method for producing a multilayer printed circuit board structure, the method comprising the steps of:
   providing an insert with an electrical component and associated rewiring;
   arranging the insert on a prepared base layer, and arranging one or more further layers over the base layer and the insert to form a layer stack, a liquid resin or prepreg layer being selected for the base layer and a layer covering the insert on the opposite side;
   laminating together and/or pressing the layer stack, the liquid resin or prepreg layer liquefying in regions adjacent to the insert and surrounding the insert on all sides without a gap;
   wherein the electrical component is mounted on a rewiring substrate of the insert, and the rewiring substrate is provided before the introduction of the insert into the layer stack with bores which fill with resin material from the surroundings during the subsequent laminating together and/or pressing step, and subsequently vias are produced in the resin-filled bores with diameters smaller than the bores in such a way that a resin material ring remains between the respective via and the neighboring edge of the rewiring substrate.

23. A multilayer printed circuit board structure, comprising:
   a layer stack made from a number of layers that are electrically insulating and provided with conductor track structures, the layer stack having a surface extent;
   an insert in the interior of the layer stack that extends laterally only in a subregion of the surface extent of the layer stack and has at least one passive or active electrical component mounted thereon, and an associated rewiring;
   the insert is embedded between two full-area, electrically insulating liquid resin layers or prepreg layers that cover the insert on both sides, the insert being surrounded on all sides without a gap by resin material liquefying upon compression or lamination of the layer stack;
   a rewiring substrate is provided with resin-filled bores; and
   vias are produced in the resin-filled bores with diameters smaller than the bores in such a way that a resin material ring remains between the respective via and the neighboring edge of the rewiring substrate.

* * * * *